United States Patent [19]

Cullum, Jr. et al.

[11] 4,247,912
[45] Jan. 27, 1981

[54] MAGNETIC BUBBLE DOMAIN CHIP WITH ENHANCED PROPAGATION MARGINS

[75] Inventors: Clifton D. Cullum, Jr., Putnam Valley; George E. Keefe, Montrose, both of N.Y.; Mark H. Kryder, Bradford Woods, Pa.; Yeong-Show Lin, Mount Kisco, N.Y.

[73] Assignee: International Business Machines Corporation, Armonk, N.Y.

[21] Appl. No.: 959,960

[22] Filed: Nov. 13, 1978

[51] Int. Cl.³ .................................. G11C 19/08
[52] U.S. Cl. .................................... 365/15; 365/36
[58] Field of Search ................................. 365/15, 36

[56] References Cited
PUBLICATIONS

IEEE Transactions on Magnetics, vol. MAG-14, No. 5, Sep. 1978, pp. 494-499.
Internation Conference on Magnetics, Paper 11-1, Florence, Italy, May 9-12, 1978.

Primary Examiner—James W. Moffitt
Attorney, Agent, or Firm—Jackson E. Stanland

[57] ABSTRACT

In magnetic bubble domain chips using layers of crystalline material having in-plane magnetization for propagation, hard bubble suppression, etc., asymmetric propagation often results due to crystalline anisotropies in the layer of in-plane magnetization. In these chips, different propagation margins result for propagation in different directions with respect to the crystalline axes of the in-plane layer. In the present magnetic chip, a plurality of shift registers is provided for movement of bubble domains in a plurality of directions, all of which provide good propagation margins. The registers are aligned in particular directions with respect to the directions of easy stripout of bubble domains in order to avoid the problem of asymmetric propagation. Examples are shown using ion implanted contiguous element propagation patterns organized in a major/minor loop type of storage organization.

36 Claims, 15 Drawing Figures

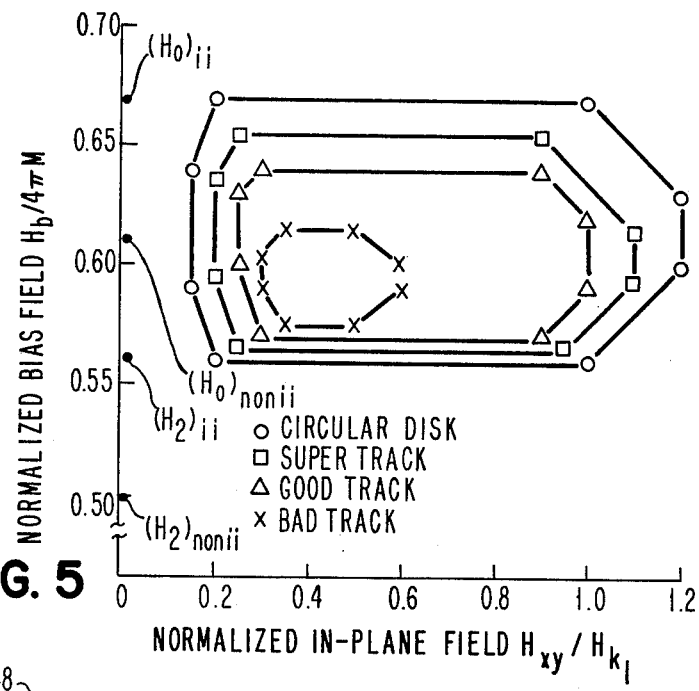
FIG. 5
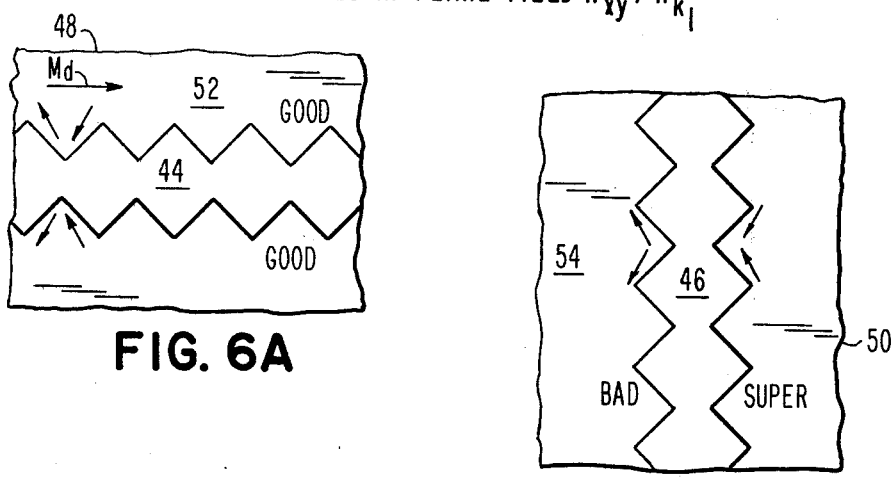
FIG. 6A
FIG. 6B
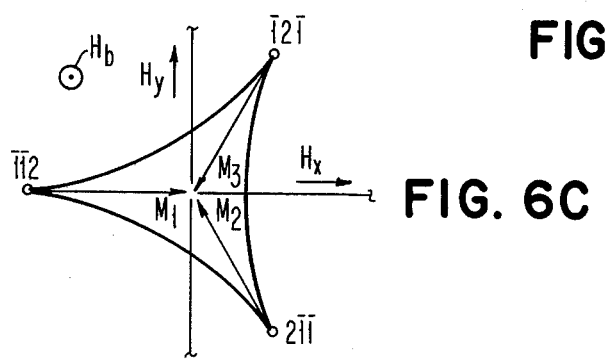
FIG. 6C

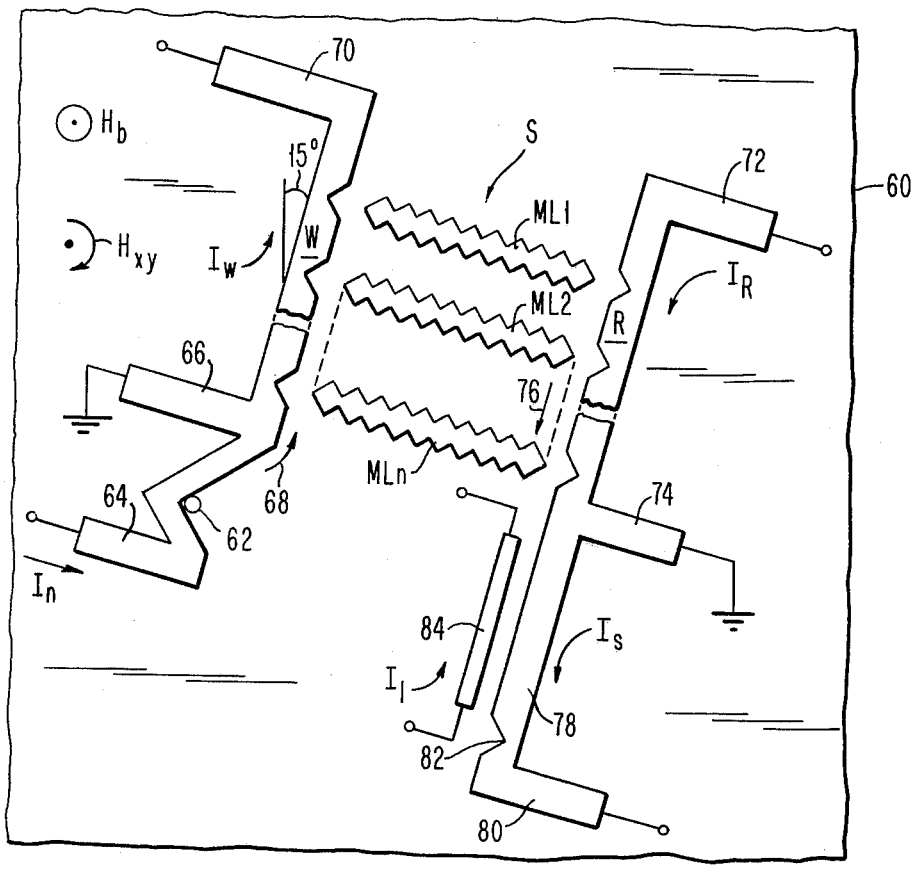
FIG. 7A
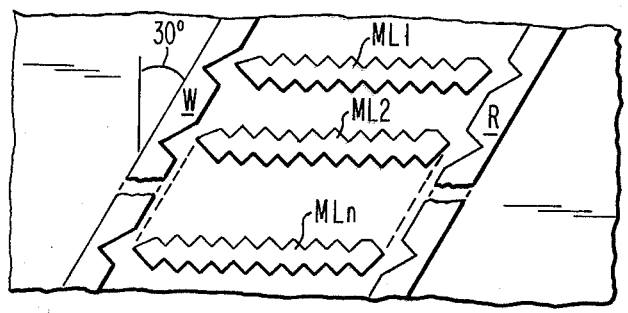
FIG. 7B
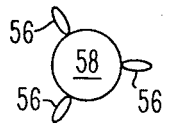

MAGNETIC BUBBLE DOMAIN CHIP WITH ENHANCED PROPAGATION MARGINS

DESCRIPTION

Technical Field

This invention relates to magnetic bubble domain chips, and in particular to such chips wherein improved propagation margins are provided for propagation of bubble domains in a plurality of directions. The chip is characterized by a plurality of bubble domain shift registers which are oriented in particular directions with respect to the easy directions for bubble domain stripout, wherein the chip includes a crystalline layer having in-plane magnetization and multidirectional crystalline symmetry.

Background Art

In many magnetic bubble domain storage chips, a plurality of registers are provided which move bubble domains along a plurality of directions. One example of such a storage chip is a major/minor loop type of chip in which magnetic bubble domains are moved along a plurality of generally orthogonal directions to provide input/output functions and storage of information.

Many magnetic bubble domain chips use crystalline layers having in-plane magnetization. For example, the top and/or bottom surface of a garnet magnetic bubble domain storage layer is often ion implanted to provide contiguous propagation elements for movement of bubble domains in the storage layer in response to the reorientation of a magnetic field in the plane of the ion implanted surface. Still further, a separate ion implanted drive layer is provided when the magnetic bubble storage layer is not easily ion implantable. Such a structure is shown in U.S. Pat. No. 4,070,658. Other types of magnetic bubble storage chips use crystalline layers having in-plane magnetization for suppression of hard bubble domains. An example of such a chip is one which has a garnet layer exchange coupled to the magnetic bubble domain storage layer, which can also be comprised of a garnet material. In another type of structure used for hard bubble suppression, a continuous crystalline layer of NiFe is exchange coupled to the bubble storage layer.

These in-plane magnetization layers, whether used for movement of bubble domains or hard bubble suppression, etc., can have easy directions of magnetization in the plane of the crystalline material comprising these layers. That is, they may exhibit anisotropies in the plane of the layers. These anisotropies in turn lead to "asymmetric propagation", which manifests itself by different propagation margins depending upon the direction of propagation with respect to the crystallographic axes of the in-plane layers. For example, for an ion implanted drive layer comprised of a garnet material, three crystallographic axes exist in the crystal corresponding to three directions of easy bubble domain stripout. Propagation of bubbles along these three crystalline axes will provide good propagation margins, while propagation along directions at different angles to these three axes will provide propagation margins of varying quality. For propagation in a direction perpendicular to any one of these three crystalline axes, bad propagation margins may result. This crystalline anisotropy effect is explained in more detail by Y. S. Lin et al in an article entitled "Charged Wall Behavior in 1-$\mu$m Bubble Implanted Structures", which appeared in the IEEE Transactions on Magnetics, Vol. MAG-14, No. 5, September 1978, on pages 494–499.

In magnetic bubble domain storage chips, a plurality of propagation registers are often used which move bubble domains along a plurality of directions. If an in-plane crystalline layer is provided for hard bubble suppression, propagation, etc., some of the registers may yield good propagation margins, while others may yield poor propagation margins. This problem is most severe when the in-plane crystalline layer is used for bubble propagation. For instance, in a major/minor loop bubble domain storage chip, the propagation registers generally provide four orthogonal directions of propagation, and the propagation margins of the poorest propagation direction will limit the overall operating margin of the storage chip.

The present invention is directed to bubble domain storage chips having bubble propagation in a plurality of directions, where all of the directions yield acceptable margins of propagation. Accordingly, it is a primary object of the present invention to provide a magnetic bubble domain chip having improved operating margins.

It is another object of the present invention to provide a magnetic bubble domain storage chip in which the margins of propagation, bubble domain generation, bubble domain transfer, and bubble domain detection are improved by making use of preferred propagation orientations.

It is another object of the present invention to provide a magnetic bubble domain storage chip using anisotropic layers having in-plane magnetization without the problems usually encountered when such in-plane layers are used.

It is a more specific object of the present invention to provide a magnetic bubble domain storage chip using shift registers comprised of contiguous propagation elements, where the shift registers are oriented in particular directions with respect to the crystallographic axes of the crystalline layer(s) in which the propagation elements are formed.

It is another specific object of the present invention to provide a magnetic bubble domain storage chip using shift registers comprised of contiguous propagation elements which are formed in ion implanted crystalline layers having in-plane magnetization, where the problem of asymmetric propagation is avoided.

It is a further object of the present invention to provide a magnetic bubble domain storage chip using magnetic charged walls for bubble domain generation, propagation, and transfer, where problems associated with magnetic anisotropies in the plane of the layer in which the magnetic charged walls are formed are avoided.

It is another object of this invention to provide a magnetic bubble domain storage chip where the propagation devices, write devices, transfer devices, and read devices are oriented to avoid asymmetric propagation problems.

BRIEF SUMMARY OF THE INVENTION

In the practice of this invention, a magnetic bubble domain storage chip is provided having a plurality of registers for movement of magnetic bubble domains along a plurality of different directions. The storage chip includes at least one crystalline layer having substantially in-plane magnetization and in which there is a crystalline magnetic anisotropy such that "easy" directions of magnetization are defined in the plane of the crystalline layer.

In order to avoid the aforementioned problem of asymmetric propagation in which the propagation margin of any shift register depends upon its orientation relative to the crystallographic axes in the plane of the crystalline layer, the devices comprising the magnetic storage chip are oriented in certain directions with respect to the crystalline axes of the crystalline layer, i.e., with respect to the directions of easy bubble domain stripout. In particular, the propagation tracks defined by the shift registers are oriented with respect to the easy strip-out directions so that good propagation margins result for bubble movement along paths defined by these shift registers. Still further, the bubble domain generators and detectors, as well as the transfer gates used to move bubble domains from one propagation path to another, are oriented to have bubble domain movement along directions selected with respect to the easy strip-out directions in the crystalline layer, in order to provide good margins for bubble domain generation, detection, and transfer.

Examples of structures providing good operating margins are provided, and in particular a storage chip comprising contiguous propagation elements is illustrated. The propagation elements can be comprised of ion implanted regions in a crystalline drive layer, or by an apertured, magnetically soft crystalline layer, etc.

These and other objects, features, and advantages will be more apparent from the following more particular description of the preferred embodiments.

BRIEF DESCRIPTION OF THE DRAWINGS

FIG. 2A is a cross-section of an implanted garnet film along the $[\bar{1}2\bar{1}]$ direction, while FIG. 2B is a stereographic projection of the [111] plane of the implanted film of FIG. 2A.

FIG. 5 is a graph showing the propagation margins of the various propagation tracks in FIG. 4.

FIGS. 6A-6C are used to explain the propagation margins of the various tracks in FIG. 4, where FIGS. 6A and 6B illustrate four orthogonal propagation tracks, while FIG. 6C is a three-vertex critical curve used to determine the planar magnetization directions in the implanted regions of FIGS. 6A and 6B.

FIGS. 7A-7C show three different storage organizations in which good propagation margins are obtained for all registers. In particular, these are major/minor loop type organizations. In FIG. 7A, the major paths and the minor loop registers are at an angle of 15° with respect to an easy direction of strip-out in the implanted drive layer. In FIG. 7B, the minor loop propagation paths are parallel to a direction of easy stripout in the drive layer, as are the write major path and read major path. In FIG. 7C, a major loop is used for both write and read functions, and the major loop as well as the minor loops lie along easy strip-out directions in the drive layer.

DETAILED DESCRIPTION OF THE PREFERRED EMBODIMENTS

FIG. 1

Figure 1:
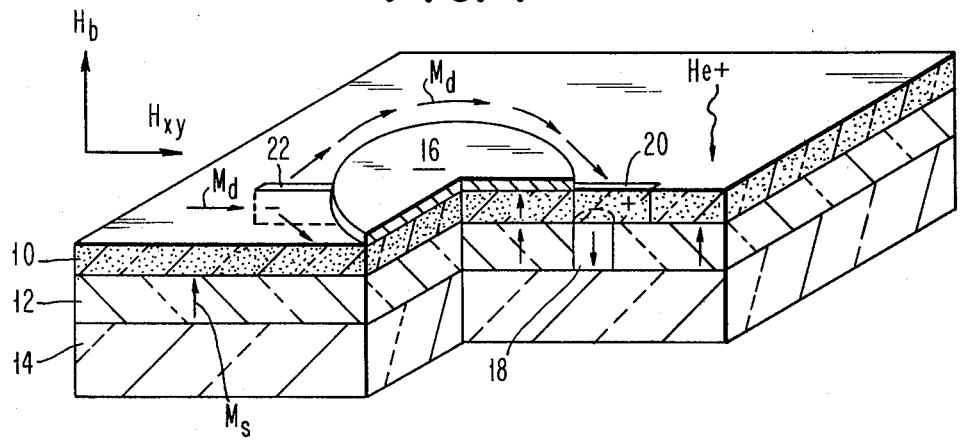
FIG. 1 shows a representative structure for movement of bubble domains using magnetic charged walls in an ion implanted drive layer which is separate from the bubble domain storage layer.

As noted, crystalline layers having in-plane magnetization often exhibit anisotropies which lead to bubble propagation in different directions with different propagation margins. FIG. 1 shows a magnetic structure in which an implanted propagation element is produced in a magnetic drive layer 10 that is formed on a magnetic bubble domain storage layer 12. Storage layer 12 is, for example, a magnetic garnet layer whose magnetization $M_s$ is directed perpendicular to the plane of layer 12. The storage layer 12 is formed on a suitable substrate layer 14. As an example, the substrate 14 can be comprised of $Gd_3Ga_5O_{12}$ (GGG) while the storage layer 12 can be an epitaxially grown garnet film such as EuYTmGaIG. The drive layer 10 is, for example, an implanted garnet layer of GdYTmGaIG. A metallic disk 16, comprised of a material such as gold, is deposited on the drive layer 10 and protects those regions of layer 10 beneath it during the ion implantation step.

In FIG. 1, the stippled regions of layer 10 are ion implanted regions produced by ion bombardment of $He^+$ ions. The magnetization of the drive layer is $M_d$.

A magnetic bubble domain 18 in storage layer 12 will move around the periphery of the disk 16 as in-plane magnetic field $H_{xy}$ reorients. This movement is due to the attractive force of a converging magnetic charged wall 20 whose magnetic flux is coupled to the magnetic flux of the bubble 18. Another charged wall 22 is on the opposite side of the disk and is a diverging charged wall. As is apparent from this figure, the converging charged wall 20 is one in which the magnetization vectors $M_d$ converge toward charged wall 20, while negative charged wall 22 is one in which the magnetization vectors $M_d$ diverge from it.

The propagation of a bubble domain along an attractive charged wall is described in more detail in aforementioned U.S. Pat. No. 4,070,658, and will not be described further here.

Contiguous propagation elements have been used in the past to move magnetic bubble domains in response to the reorientation of field $H_{xy}$ in the plane of the drive layer 10. These bubble domains have diameters that are stabilized by the bias field $H_b$, which is perpendicular to the direction of magnetization in storage layer 12. However, due to the crystalline nature of drive layer 10, and to the fact that the magnetization $M_d$ of the drive layer is not always precisely in the plane of this layer, anisotropic effects result. These effects cause the formation of preferred directions of bubble domain motion. These anisotropy effects will be explained in more detail in the following section.

Propagation Anisotropy Due to Crystalline Effects
(FIGS. 2A, 2B, 3, 4, 5, 6A–6C)

Due to crystalline effects, there are three favorable bubble positions around an implanted hole in the garnet drive layer shown in FIG. 1. The following will be a brief description of this effect, reference being made to the aforementioned technical article by Y. S. Lin et al for more detail.

Figure 2A:
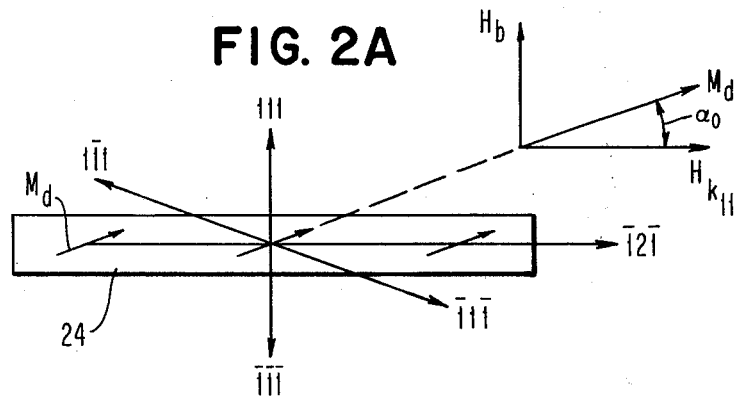
FIGS. 2A and 2B illustrate the geometrical considerations which lead to asymmetric propagation in an ion implanted garnet drive layer.

FIG. 2A shows a cross-section of an ion implanted garnet film 24, which could be the drive layer 10 of FIG. 1. This cross-section is along the [$\bar{1}2\bar{1}$] direction of the layer and shows the magnetization angle $\alpha_0$ between the magnetization ($M_d$) direction and the plane of layer 24. The effective in-plane anisotropy field is denoted $H_{k\parallel}$.

Figure 2B:
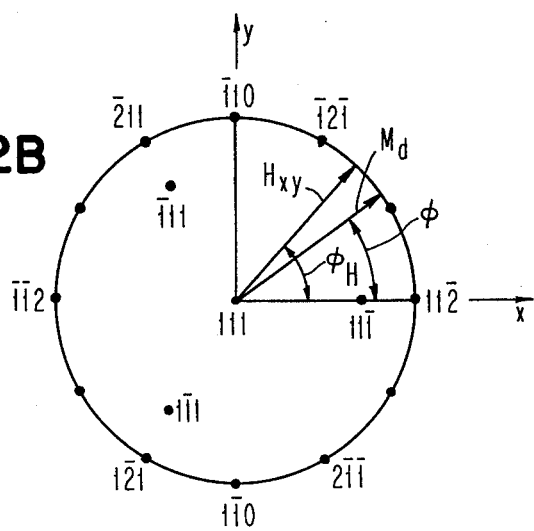

FIG. 2B is a stereographic projection of the (111) plane showing the angle $\phi$ between the magnetization vector $M_d$ and the x direction, as well as the angle $\Phi_H$ between the drive field $H_{xy}$ and the x direction. For the bias field $H_b$ as shown in FIG. 2A, the crystalline anisotropy energy term in the equation for the total energy density of the system reaches a minimum for three values of $\phi$ at 0°, 120°, and 240°. Thus, the three crystalline axes [$11\bar{2}$], [$\bar{2}11$], and [$1\bar{2}1$] are "easy" directions of the magnetization. The anisotropy energy reaches a maximum for the opposite directions (i.e., $\phi=60°$, 180°, and 300°). If the bias field $H_b$ is reversed the angle $\phi$ for the three minimum and maximum energy states, as well as the three easy magnetization directions, are reversed. As will be more apparent, bubble domains always attach to a disk along preferred crystal directions where the attractive charged walls are located.

Figure 3:
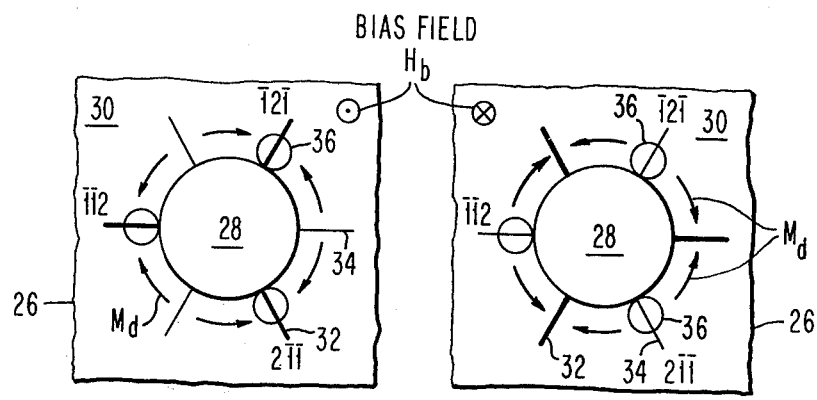
FIG. 3 illustrates the stable positions for bubble domains around an implanted hole in a magnetic layer, for two opposite directions of the bias field $H_b$.

FIG. 3 shows a garnet magnetic drive layer 26 having a masking disk 28 thereon. Masking disk 28 can be comprised of gold, and is used to protect the regions of layer 26 thereunder during the ion implantation step. Thus, regions 30 surrounding disk 28 are ion implanted and have in-plane components of magnetization $M_d$. Converging charged walls 32 are shown as heavy lines, while diverging charged walls 34 are indicated as thin lines. Bubble domains are indicated by the circles 36. FIG. 3 shows the preferred positions of bubble domains around the periphery of disk 28, for two opposite orientations of bias field $H_b$. As will be noted, bubbles always attach to a disk along crystal directions [$\bar{1}12$], [$\bar{1}2\bar{1}$], and [$2\bar{1}\bar{1}$], regardless of bias field orientation. These crystal directions are those where the attractive charged walls are located.

As illustrated in FIG. 3, as a result of reversing the bias field $H_b$, the three easy magnetization directions reverse (as indicated by the arrows $M_d$) so that the three positions for forming the converging/diverging charged walls around disk 28 also reverse. The end result is that three identical stable bubble positions are formed, since the polarities for the bubbles and for the attractive charged walls also reverse. These three preferred crystal directions also correspond to the three easy directions for bubble strip-out, which are determined by circulating a bubble domain around a disk at a low bias field. When this is done, it is found that the bubbles stripe out along the directions of the attractive charged walls, which are preferred locations for the bubble around the disk 28.

Figure 4:
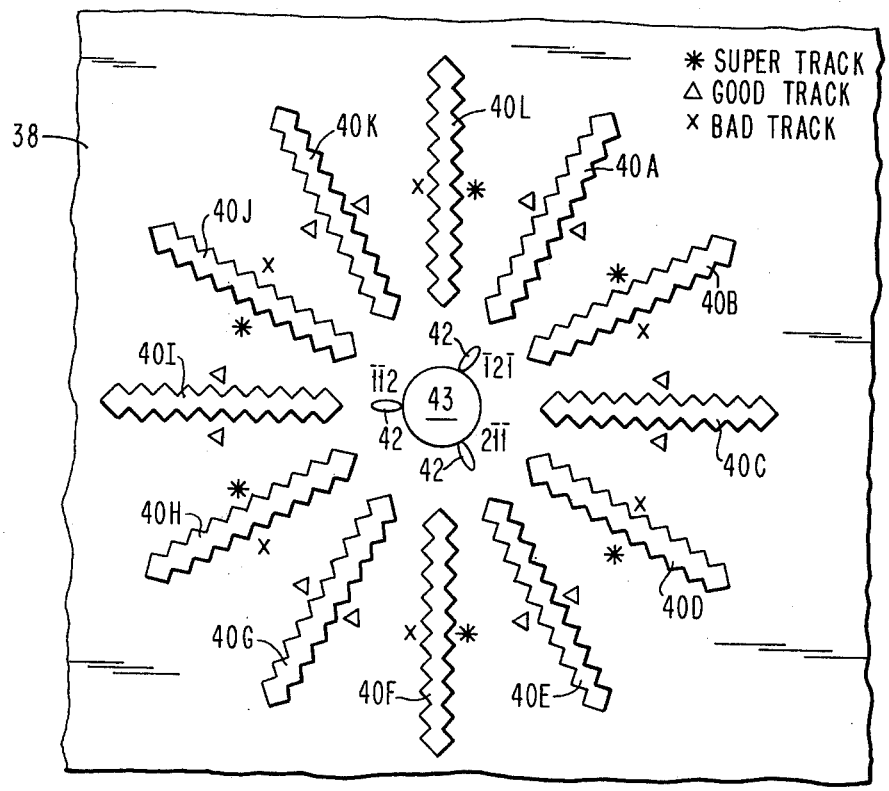
FIG. 4 shows a plurality of propagation shift registers arranged radially about a common center point, illustrating the different qualities of propagation tracks for different orientations of the tracks with respect to the crystalline axes of the magnetic drive layer in which the tracks are formed.

FIG. 4 shows a plurality of propagation tracks comprised of ion implanted regions in a magnetic drive layer 38. The propagation tracks are along the boundaries of ion implanted regions of layer 38. These implanted regions are formed by ion implantation of layer 38 around metal masks 40A–40L.

In the center of this "sunburst" pattern, the three easy strip-out directions [$\bar{1}12$], [$1\bar{2}1$], and [$2\bar{1}1$] are represented by the elongated bubbles 42 at the edges of masking disk 43.

In FIG. 4, the angle between two adjacent (non-parallel) contiguous propagation tracks is 30°. The legend denoting the type of propagation track (super, good and bad) is indicated by an asterisk, triangle, and x, respectively.

As is apparent from FIG. 4, propagation tracks which are parallel to one of the three easy bubble strip-out directions have "good" bias field margins. However, tracks which are orthogonal to these good tracks with their peaks (convex portions) pointed along one of the three easy strip-out directions exhibit a significant (over one-third) reduction in operating margin. Conversely, tracks at the opposite sides of the "bad" tracks typically exhibit a larger bias field margin than those tracks having good bias field margins. Stated another way, when a strip-out direction is perpendicular and into the cusps of the propagation track, it is a "super" propagation track. When the strip-out direction is perpendicular to and directed out of the cusp of the propagation track, it is a bad propagation track. Further, when the strip-out direction is parallel to the propagation track, then the propagation track is good.

For example, the tracks on each side of masks 40C and 40I are directed along the $\bar{1}12$ easy strip-out direction and therefore bubble domains will travel along these tracks with good bias field margins. In contrast with this, one track along mask 40B is super, while the track on the other side is bad. The reason for this is that strip-out direction $2\bar{1}\bar{1}$ is perpendicular to and directed into the cusps on the super track while it is perpendicular to and directed away from the cusp on the bad propagation track. Since converging walls provide favorable propagation while diverging walls provide unfavorable propagation, one track is super while the other is bad. These effects will be more apparent when FIGS. 6A–6C are described.

FIG. 5 shows the operating margins of a super propagation track, a good propagation track, a bad propagation track, and propagation around a circular disk. As is apparent from this plot, the widest margins are obtained for propagation around a circular disk, while the best pattern for propagation is that corresponding to the super track. In a composite garnet structure using the materials described previously, and with a 0.28 $\mu$m thick drive layer atop a 1.04 $\mu$m thick storage layer, the bias field ranges for quasistatic propagation with a 40 Oe drive field were 262–310 Oe for the super tracks, 264–300 Oe for the good tracks, and 265–275 Oe for the bad tracks. In this example, the implantation ions were He$^+$ applied at a dosage of $3.5 \times 10^{15}$ He$^+$/cm$^2$, at 100 KeV.

In FIG. 5, the bias field $H_b$ is normalized to $4\pi M$, which is the magnetization magnitude of both the storage and drive garnet layers. The film thickness is assumed to be 10 l and 4 l for the storage and drive layers respectively, where l is the material characteristic length. The points $H_0$ and $H_2$ refer to the free bubble collapse and run-out fields in non-implanted (non ii) and implanted (ii) areas.

In FIG. 5, the in-plane field $H_{xy}$ is normalized to $H_{K1}$, which is an effective crystalline anisotropy field defined as $$H_{K1} = 3\sqrt{2} \sin \alpha \cos^2 \alpha |K_1|/M.$$

$K_1$ is the crystalline anisotropy constant, and $\alpha$ is the magnetization angle in the implanted areas tilting out of the film plane. In this drive layer material, $K_1 = 5,000$ erg/cm$^3$, $4\pi M = 600$ G, and $\alpha$ is approximately 14°. An effective crystalline field $H_{K1}$ of approximately 100 Oe results.

The operating margins plotted in FIG. 5 are representative ones only. Some samples will exhibit a more serious disparity of bias field range than others. Further, annealing in He and removal of the implantation-protecting gold patterns tends to improve, but not cure, propagation along bad tracks.

The difference in operating margin of the different propagation tracks can be explained in terms of the charged wall behavior associated with good, bad, and super tracks. FIGS. 6A-6C are used to describe asymmetrical bubble propagation and illustrate an example with no applied in-plane magnetic field $H_{xy}$.

FIGS. 6A and 6B show four propagation tracks, where two horizontal tracks are on opposite sides of the ion implantation mask 44, while two vertical propagation tracks are on opposite sides of the ion implantation mask 46. The arrows directed into and out of the cusps along the propagation tracks represent the direction of magnetization in the magnetic drive layers 48 and 50 after demagnetization. Regions of drive layer 48 under mask 44 are protected from ion implantation while regions 52 around the mask 44 are ion implanted. Correspondingly, regions 54 surrounding mask 46 are ion implanted, while those regions of drive layer 50 protected by mask 46 are not ion implanted.

The critical curve in FIG. 6C depicts the three directions of easy magnetization for a drive layer with the bias field $H_b$ directed out of the plane of the drawing. Arrows $M_1$, $M_2$ and $M_3$ indicate these easy magnetization directions, which are obtained when there is a minimum crystalline anisotropy energy. The magnetization vectors around the cusps associated with the various propagation tracks in FIGS. 6A and 6B have directions parallel to the directions of the arrows $M_1$, $M_2$ and $M_3$.

In FIG. 6A, the two good propagation tracks exhibit "non-charged" walls around the cusps of the contiguous propagation elements. As is apparent from that figure, the magnetization arrows along the cusps point into and away from each of the cusps and therefore "charged" walls (resulting from oppositely directed magnetization vectors) do not result. Bubbles propagating along these good propagation tracks, while not being held for a period of time in the cusps, nevertheless have good margins.

In FIG. 6B, the bad propagation track has diverging magnetization vectors in the cusp regions of the track, while the super track has magnetization vectors which converse into the cusps on that side of the track. Bubble domains are held in the cusps of the super track as the in-plane field reorients and then follow the moving charged walls to the next cusps. On the other hand, bubble domains are repelled out of the cusps along the bad propagation track and low bias field margins result.

When the domain patterns illustrated in FIGS. 6A and 6B are observed under the influence of a slowly rotating in-plane drive field $H_{xy}$, a behavior occurs which is similar to the situation illustrated in these figures (where there was no field $H_{xy}$). In the super track orientation, magnetization into the track cusps combine to make the attractive charged wall strong and good bubble propagation results. The opposite circumstance occurs on the adjoining bad track whereby primarily strong repelling walls occur. In the two good propagation tracks of FIG. 6A, the non-charged walls are replaced by the newly formed charged walls controlled by the in-plane field orientation and the pattern curvature (concave versus convex), so that the underlying bubbles have no trouble in attaching to the propagating charged walls.

Storage Organizations and Chip Layout (FIGS. 7A-7C and 8A-8C)

Figure 7C:
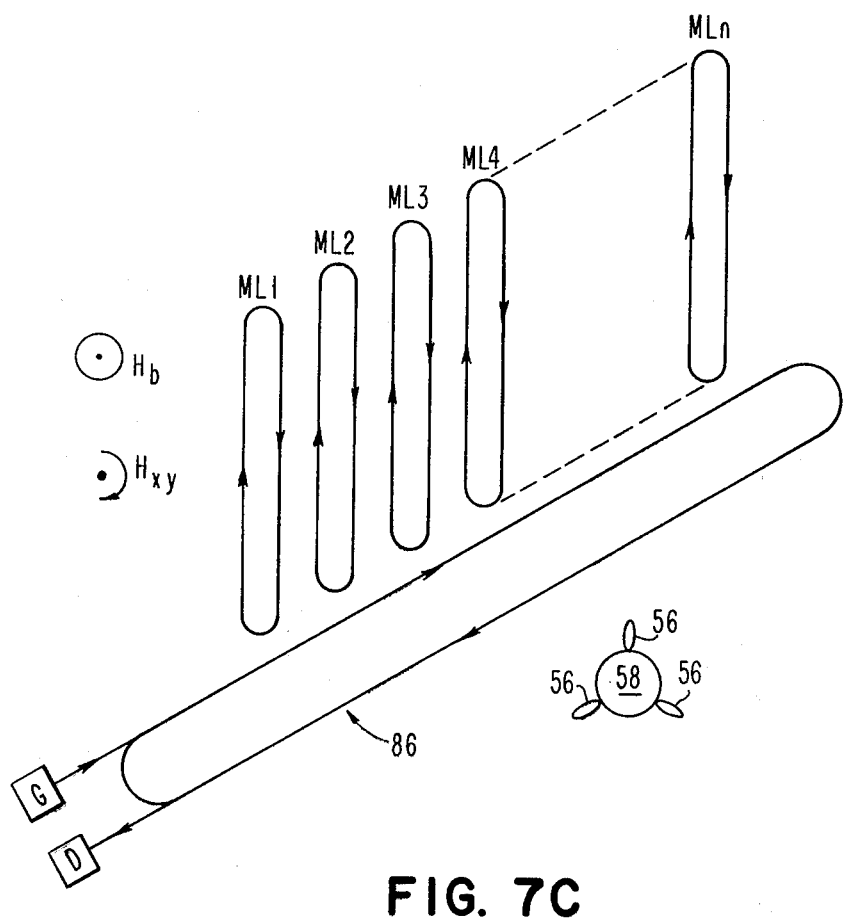
Figure 8A:
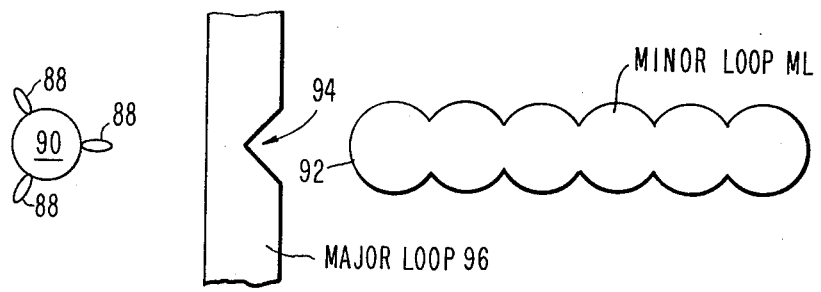
FIGS. 8A-8C illustrate geometries for three different charged wall transfer switches used to move magnetic bubble domains back and forth between the major path and the minor loop storage paths.
Figure 8B:
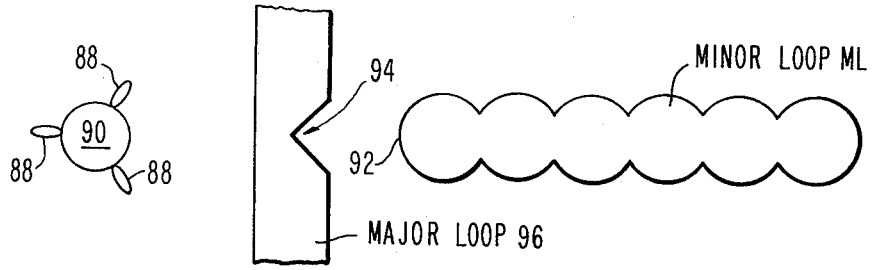
Figure 8C:
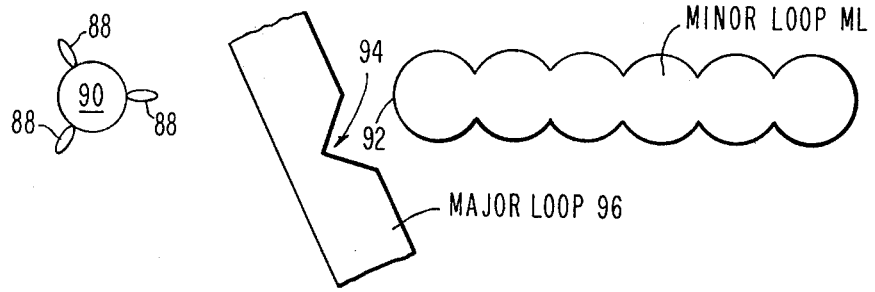

The difficult issue arising from the asymmetrical bubble propagation effect is that of mapping effectively the three-fold driving force of the ion implanted garnet layer onto the four-fold arrangement generally found in bubble domain storage systems. For example, a major/minor loop storage organization uses propagation tracks which are orthogonal to one another and extend in the ±x directions and ±y directions. This issue is particularly difficult when it is remembered that functions other than propagation have to be provided. For example, bubble domains have to be transferred from one propagation register to another and this necessitates transfer switches. Still further, bubble generation and bubble detection have to occur in a complete magnetic bubble domain storage chip and, for these functions, bubble movement is often required. Since the ease of bubble domain movement depends upon the orientation of the generation, sensing, and transfer devices with respect of the crystallographic axes of the bubble drive layer, these factors have to be taken into account when designing a complete system. FIGS. 7A-7C show various embodiments which will provide good operating margins in a complete storage chip, while FIGS. 8A-8C show considerations relative to transfer switch design.

In FIG. 7A, an orthogonal major/minor loop arrangement is oriented at 15° with respect to an easy strip-out direction, as represented by the elongated bubbles 56 around the disk 58. In this embodiment, the symmetry effect is reduced so that the repulsive and attractive charged walls can no longer be readily formed along the bad and super tracks, respectively. The end result is that all four tracks (along one side of the write major path, along one side of the read major path, and along both sides of the minor loop storage registers) behave like "good" tracks, with only minor differences in bias field margins. Angles of about ±12°-18° appear to yield propagation tracks having acceptable operating margins.

In more detail, the minor loop storage registers ML1, ML2, . . . MLn are located between the write major path W and the read major path R. These propagation paths are along the edges of ion implanted regions of the magnetic drive layer 60 as described with respect to FIG. 1. These ion implantation regions are produced by ion implantation of drive layer 60 through a metallic mask, which also provides current carrying functions, as described in a copending application to G. E. Keefe, Ser. No. 839,720, filed Oct. 5, 1977 and assigned to the present assignee, now U.S. Pat. No. 4,164,029.

Since the operation of a major/minor loop memory of the type shown in FIG. 7A is well known in the art, only a limited description will be provided. Thus, bubble domains 62 are produced by a current nucleator when a current $I_n$ flows through conductor 64 and then to ground through conductor 66. Domain 62 moves along the path indicated by arrow 68 to the edge of write major path W. When a domain is opposite the minor loop storage resistor to which it is to be transferred, a current $I_w$ flows through conductor 66 and through conductor portion 70. This produces a transfer of the bubble domains from the write major path to the associated minor loop storage registers, where the domains move across a magnetic charged wall substantially bridging the write major path and the minor loop storage registers. Such charged wall assisted transfer switches are shown in a copending application Ser. No. 755,897, filed Dec. 30, 1976 and assigned to the present assignee, now U.S. Pat. No. 4,142,250.

When it is desired to read-out information from the minor loop storage registers ML1-MLn, a current $I_R$ flows through conductors 72 and 74. Bubble domains in the storage minor loops follow bridging charged walls to the read major path R and then propagate in the direction of arrow 76 to a bubble domain detection device. In this embodiment, the detection device is comprised of conductor portions 74, 78, and 80, through which a current $I_s$ flows to stretch a bubble domain along conductor portion 78. The elongated domain has its leading end attracted to cusp 82, and couples its flux to the sensing element 84. Element 84 is typically comprised of permalloy or another type of magnetoresistive sensing material. When a current $I_1$ flows through sensing element 84, the presence of the elongated domain will be indicated, as is well known in the art.

In the practice of this invention, it should be noted that the bubble domain nucleator and bubble domain detection device are designed so that bubble domain movement in these devices is along a propagation direction such as that used for propagation in the read and write major paths. This insures that good operating margins will result for these devices.

After detection, the elongated domain shrinks to cusp 82 when the direction of current $I_s$ is reversed. This annihilates the domain so that another domain can be detected.

FIG. 7B illustrates an embodiment in which a non-orthogonal major/minor loop storage arrangement is provided. Here, the bubble domain read and write circuits, as well as the detail of the transfer switches, are not shown for ease of illustration.

In FIG. 7B, all four propagation tracks are parallel to an easy strip-out direction. A similar arrangement can be approximated by tilting only the minor loops. The same reference designations are used that were used in FIG. 7A, since the functions of the registers shown are the same.

In FIG. 7B, the margins for propagation will be slightly better than that for FIG. 7A, since all tracks are exactly aligned with easy strip-out directions. However, it is apparent that the ends of the minor loop propagation registers are slightly distorted in order that a bridging charged wall can be achieved between the cusps of the write major path W and each of the minor loops, as well as between the cusps of the read major path R and the adjacent tips of the minor loop registers. Still further, the embodiment of FIG. 7B uses a slightly larger amount of area of the magnetic chip.

FIG. 7C schematically illustrates a major/minor loop type of memory organization using only a single major path for input and output of bubble domains. These paths are illustrated schematically, since the propagation element patterns used to make the major and minor loops are well known in the art, and have been illustrated heretofore in this application. Thus, a plurality of minor loops ML1, ... MLn are shown, where the direction of bubble propagation along each of these is indicated by the arrows. These propagation directions are along the easy strip-out directions and therefore propagation in the minor therefore loops has good margins.

A bubble domain generator G is provided for selective writing of bubble domains into a major loop 86. Bubbles propagate around this loop in the direction of the arrows as field $H_{xy}$ reorients. The directions along both sides of major loop 86 are also in a direction of easy strip-out and therefore propagation along major loop 86 also has good propagation margins.

A detector D is provided for read-out of bubble domains from the major loop. A replicator can be used to replicate information from major loop 86 to the detector D, while retaining the information in major loop 86. Structures for achieving replication/transfer are well known in the art and will not be described herein.

FIGS. 8A-8C show three orientations of a major path and an associated minor loop, as well as the easy directions for strip-out. These directions are indicated by the elongated domains 88 around the disk 90. In all of these embodiments, domains transfer along a bridging charged wall located between the tip 92 of the minor loop ML and a cusp 94 located along the propagation edge of the major path 96.

With the orientations shown in FIG. 8A, the major path 96 is a bad track for bubble propagation. Major-to-minor loop transfer frequently occurs automatically, and margins for transfer from the minor loop to the major path 96 are very poor.

For the embodiment of FIG. 8B, propagation in the major path 96 is along a super track, and margins for transfer from the minor loop to the major path are excellent. However, margins for transfer from the major path to the minor loop are bad.

For the orientation shown in FIG. 8C, both the major path and the minor loop propagation path are good propagation tracks. Furthermore, margins for transfer from the major path to the minor loop, and vice versa, are both good.

In the practice of this invention, magnetic bubble domain chips are provided in which the major paths and/or minor paths are directed along easy directions for strip-out (or at a small angle with respect to these directions) to provide optimal operations of contiguous disk bubble chips. Good propagation margins, good transfer margins, and optimal stretching of bubble domains in a detector are all simultaneously obtained in a single chip design. In a more general sense, all registers are oriented to provide bubble propagation along directions which yield favorable propagation margins, whether those directions are parallel to or perpendicular to easy stripout directions.

This invention is particularly directed to bubble domain chips in which domains are moved in a plurality of directions, and in which a crystalline layer is provided having multi-directional symmetry, where the crystalline axes for easy strip-out of bubbles are not orthogonal to each other. In this environment, the invention teaches a technique for effectively mapping propagation tracks and other device functions into the symmetry defined by the easy strip-out directions of the crystalline material.

Those of skill in the art will be able to devise further embodiments in accordance with the principles set forth in the present invention.

Having thus described our invention, what we claim as new, and desire to secure by Letters Patent is:

1. A magnetic bubble domain chip, comprising:
   a magnetic medium in which bubble domains can be moved,
   at least one crystalline layer having its magnetization substantially in the plane of said layer and exhibiting multi-directional crystalline symmetry in the plane of said layer, there being at least two directions along which a bubble domain will easily strip-out,
   a plurality of registers for moving said bubble domains in said magnetic medium along preferred directions having an orientation relationship to said crystalline symmetry in the plane of said layer to define propagation tracks which provide good propagation margins for movement of bubbles therealong, at least one of said propagation tracks being along one of said directions of easy strip-out of a bubble domain.

2. The chip of claim 1, where said registers are comprised of propagation elements formed in said crystalline layer.

3. The chip of claim 2, where the propagation elements in said registers are contiguous to one another.

4. The chip of claim 1, where said crystalline layer has a garnet structure and exhibits tri-directional crystalline symmetry with three directions of easy strip-out for bubble domains.

5. The chip of claim 4, where said crystalline layer has ion implanted regions therein having a component of magnetization substantially in the plane of said layer.

6. The chip of claim 1, where each said register is comprised of contiguous propagation elements defining an undulating propagation track comprised of concave and convex portions along which said bubble domains move as magnetic charged walls move along said undulating track to pull said bubble domains therealong, each said undulating track being oriented with respect to said multi-directional crystalline symmetry such that diverging magnetic charged walls do not exist at said concave portions of each said propagation track after demagnetization.

7. The chip of claim 6, where the orientations of said registers are such that at least one of said registers defines a propagation track that is substantially parallel to one of said easy strip-out directions.

8. The chip of claim 6, where the orientations of said registers are such that at least one of said registers defines a propagation track that is substantially perpendicular to one of said easy strip-out directions, there being attractive magnetic charged walls located at the concave portions of said undulating propagation track of said register which is substantially perpendicular to said easy strip-out direction, after demagnetization.

9. The chip of claim 6, further including generator means for forming bubble domains in said magnetic medium, transfer means for transferring bubble domains from one propagation track to another, and read means for detecting said bubble domains in said magnetic medium, said generator means, transfer means, and read means being aligned for bubble domain movement therein along directions having good margins.

10. The chip of claim 6, where at least one of said registers defines a propagation track for movement of bubble domains along a direction which makes a small angle with respect to one of said easy strip-out directions.

11. The chip of claim 10, where said angle is approximately $\pm 12°-18°$.

12. The chip of claim 6, where at least one of said registers is parallel to an easy strip-out direction and at least one other of said registers is substantially perpendicular to a direction of easy strip-out with converging charged walls located along the concave portions of said undulating propagation track defined by said register that is substantially perpendicular to said easy strip-out direction, after demagnetization.

13. The chip of claim 6, where at least two of said propagation tracks are parallel to easy strip-out directions.

14. The chip of claim 6, having at least four propagation tracks, all of which are substantially along easy directions of strip-out of said bubble domains.

15. The chip of claim 14, where said four propagation tracks include two pairs of propagation tracks having substantially parallel tracks in each of said pairs, the tracks in one pair being substantially perpendicular to the tracks in said other pair.

16. The chip of claim 6, including at least four different propagation tracks arranged to form a parallelogram.

17. The chip of claim 2, further including transfer means for transferring bubble domains from one of said propagation tracks to another where said two propagation tracks between which transfer occurs are each parallel to a different direction of easy strip-out of said bubble domains, said transfer means including means for producing a magnetic charged wall extending along a direction of easy strip-out and substantially bridging said two propagation tracks.

18. The chip of claim 6, including at least two propagation tracks, one of said tracks being substantially parallel to an easy strip-out direction for bubble domains and the other being substantially perpendicular to an easy strip-out direction with converging charged walls at the concave portions of said undulating track, after demagnetization, and further including transfer means for producing a bridging charged wall between said two tracks.

19. A magnetic bubble domain chip, comprising:
   a magnetic bubble domain medium in which bubble domains can be moved in response to the reorientation of a magnetic field,
   a crystalline layer which has been ion implanted to define a plurality of registers each of which is comprised of contiguous propagation elements, said registers defining undulating propagation tracks having cusp regions therealong, there being magnetic charged walls produced along said registers as said magnetic field reorients, magnetic charged walls being produced at the edges of said registers and moving along said undulating propagation tracks as said magnetic field reorients in the plane of said registers,
   said crystalline layer exhibiting multi-directional symmetry which defines at least one direction of easy strip-out of bubble domains in said magnetic medium, said registers being oriented with respect to said easy strip-out directions such that no register is substantially perpendicular to an easy strip-out direction in said crystalline layer with diverging charged walls located at the cusp regions along said registers, after demagnetization.

20. The chip of claim 19, having at least one of said propagation tracks substantially parallel to said easy strip-out direction.

21. The chip of claim 20, having at least one of said propagation tracks substantially perpendicular to an easy strip-out direction with converging charged walls along the cusp regions of said track which is substantially perpendicular to an easy strip-out direction, after demagnetization.

22. The chip of claim 19, where said plurality of registers are organized in a major/minor loop configuration, there being one set of propagation tracks defining minor loops for storage of said bubble domains, each of said propagation tracks in said minor loops being directed along a first easy strip-out direction of bubble domains, and further including a second set of propagation tracks defining major paths in said major/minor loop configuration, the propagation tracks in said second set of tracks being substantially parallel to another easy strip-out direction of magnetization.

23. The chip of claim 22, further including transfer means for transferring bubble domains between said minor loops and said major propagation tracks, said transfer means including means for producing a magnetic charged wall substantially bridging said major paths and said minor loops.

24. The chip of claim 19, where said registers are organized in a major/minor loop configuration, there being a first set of propagation tracks forming minor loops for storage of bubble domain information, said first set of propagation tracks being oriented at an angle of approximately ±(12°-18°) with a first easy direction for strip-out of bubble domains, and further including at least one other propagation track for defining a major path in said major/minor loop configuration, said major path being substantially parallel to an easy strip-out direction.

25. The chip of claim 24, further including write means located along said major propagation path for producing bubble domains in said magnetic medium, and read means located along a major path of said configuration for stretching a bubble domain to be sensed in a direction along said major path and a sensing element responsive to the presence of said stretched domain.

26. The chip of claim 24, including transfer means for transferring bubble domains between said at least one major path and said propagation tracks defining said minor loops, said transfer means including means for producing a charged wall substantially bridging said major path and said minor loops.

27. The chip of claim 26, further including a write means for generating bubble domains in said magnetic medium, said write means being located along said major path, and a read means located along said major path and including means for stretching a bubble domain in a direction along said major path, said read means further including a sensing element responsive to a domain stretched along said major path.

28. A magnetic bubble domain chip, comprising:
a magnetic medium in which bubble domains can be moved,
a plurality of registers for movement of isolated bubble domains, said registers being configured in a major/minor loop type of memory organization, the propagation tracks along which bubble domains move in said minor loops being at an angle other than approximately 90° with the propagation tracks along which bubble domains move in said major path,
said chip including a crystalline layer exhibiting in-plane magnetization and multi-directional crystalline symmetry in the plane of said layer, there being directions in the plane of said crystalline layer along which bubble domains will easily strip-out,
at least one of said propagation tracks in said major path or said minor paths being substantially parallel to an easy direction of bubble domain strip-out.

29. The chip of claim 28, where said registers are formed in said crystalline layer, and include propagation elements which are contiguous to one another.

30. The chip of claim 29, further including write means located along said major path and read means located along said major path, bubble domain movement in said write means and said read means being along the direction defined by said major path.

31. The chip of claim 30, where said registers are formed along the edges of ion implanted regions in said crystalline layer.

32. A magnetic bubble domain chip in which magnetic bubble domains are moved in a plurality of directions in a magnetic medium in response to the reorientation of a magnetic field in the plane of the medium, comprising:
a patterned layer of crystalline material having a component of magnetization in the plane of said patterned layer, said patterned layer comprising a plurality of registers for movement of bubble domains in said magnetic medium in said plurality of directions, said patterned layer exhibiting crystalline anisotropy in the plane of said layer, and a plurality of non-orthogonal directions for easy strip-out of bubble domains in said magnetic medium,
wherein each of said registers is oriented along particular directions with respect to said directions of easy strip-out in order to provide good propagation margins along the propagation tracks defined by each said register, wherein at least one of said propagation tracks is substantially parallel to one of said directions of easy strip-out.

33. The chip of claim 32, where the propagation tracks along all of said registers are substantially parallel to directions of easy strip-out of bubble domains.

34. The chip of claim 32, where at least one of said registers provides a perpendicular propagation track which is directed substantially perpendicular to one of said directions of easy strip-out, said register having the perpendicular track being comprised of an undulating edge having concave and convex portions where converging charged walls are located at said concave portions after demagnetization of said patterned layer.

35. The chip of claim 32, further including means for generating bubble domains in said magnetic medium, means for transferring bubble domains from one propagation track to another, and sensing means for detection of bubble domains, said bubble domains being stretched in said sensing means in a direction along one of the directions of easy strip-out of bubble domains.

36. The chip of claim 35, where said patterned layer is comprised of a garnet material having tri-directional crystalline symmetry and three directions of easy magnetic domain strip-out.

* * * * *